(12) United States Patent
Wu et al.

(10) Patent No.: US 12,205,907 B2
(45) Date of Patent: Jan. 21, 2025

(54) SEAL RING STRUCTURES

(71) Applicant: Taiwan Semiconductor Manufacturing Company, Ltd., Hsin-Chu (TW)

(72) Inventors: Yu-Bey Wu, Hsinchu (TW); Yen-Lian Lai, Hsinchu (TW); Yung Feng Chang, Hsinchu (TW); Jiun-Ming Kuo, Taipei (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 466 days.

(21) Appl. No.: 17/555,995

(22) Filed: Dec. 20, 2021

(65) Prior Publication Data

US 2023/0197640 A1    Jun. 22, 2023

(51) Int. Cl.
*H01L 23/58* (2006.01)
*H01L 23/00* (2006.01)
(Continued)

(52) U.S. Cl.
CPC .......... *H01L 23/585* (2013.01); *H01L 23/562* (2013.01); *H01L 29/0665* (2013.01); *H01L 29/42392* (2013.01); *H01L 29/78696* (2013.01)

(58) Field of Classification Search
CPC ..... H01L 21/823431; H01L 21/823821; H01L 21/845; H01L 27/0886; H01L 27/0924; H01L 27/1211; H01L 29/41791; H01L 29/42392; H01L 29/66795; H01L 29/785; H01L 2029/7858; H01L 2924/13067; H01L 23/562; H01L 23/564; H01L 23/585; H01L 29/0665; H01L 29/0684; H01L 29/0692; H01L 29/0696; H01L 29/08; H01L 29/0843; H01L 29/0847; H01L 29/42372;
(Continued)

(56) References Cited

U.S. PATENT DOCUMENTS 8,217,394 B2    7/2012  Yang et al.
8,436,472 B2    5/2013  Chen
(Continued)

FOREIGN PATENT DOCUMENTS

KR    20220136527 A  * 10/2022  ....... H01L 29/42392
TW    200605147 A    2/2006
(Continued)

OTHER PUBLICATIONS

Translation of KR-20220136527-A (Year: 2022).*

*Primary Examiner* — Nicholas J Tobergte
*Assistant Examiner* — William Henry Anderson
(74) *Attorney, Agent, or Firm* — HAYNES AND BOONE, LLP

(57) ABSTRACT

Integrated circuit (IC) chips and seal ring structures are provided. An IC chip according to the present disclosure includes a circuit region and a seal ring region surrounding the circuit region. The seal ring region includes a first active region extending lengthwise in a first direction and a first gate structure disposed on the first active region. The first gate structure extends lengthwise in a second direction that is tilted from the first direction. The first direction and the second direction form a tilted angle therebetween.

20 Claims, 11 Drawing Sheets

(51) Int. Cl.
*H01L 29/06* (2006.01)
*H01L 29/423* (2006.01)
*H01L 29/786* (2006.01)

(58) Field of Classification Search
CPC ........... H01L 29/42376; H01L 29/4238; H01L 2924/35–35121; H10B 12/056; H10B 12/36; H10B 12/09
See application file for complete search history.

(56) References Cited

U.S. PATENT DOCUMENTS

| | | |
|---|---|---|
| 10,727,218 B2 | 7/2020 | Wu et al. |
| 2009/0085168 A1 | 4/2009 | Kobayashi et al. |
| 2010/0078769 A1 | 4/2010 | West et al. |
| 2012/0270379 A1 | 10/2012 | Lai et al. |
| 2015/0021713 A1* | 1/2015 | Cheng ................. H01L 29/0619 257/487 |
| 2016/0172359 A1* | 6/2016 | Yoon ..................... H01L 23/585 257/401 |
| 2018/0144989 A1* | 5/2018 | Hu ......................... H01L 29/785 |
| 2019/0131255 A1* | 5/2019 | Teng ....................... H01L 24/94 |
| 2020/0381531 A1* | 12/2020 | Chung .............. H01L 29/41791 |
| 2021/0257449 A1* | 8/2021 | Hong .............. H01L 21/823431 |
| 2022/0037521 A1* | 2/2022 | You .................... H01L 29/1033 |
| 2022/0093594 A1* | 3/2022 | Song .................... H01L 27/092 |
| 2023/0040287 A1* | 2/2023 | Lai .................... H01L 29/78696 |

FOREIGN PATENT DOCUMENTS

| | | |
|---|---|---|
| TW | 201535729 A | 9/2015 |
| TW | 202145365 A | 12/2021 |

* cited by examiner

SEAL RING STRUCTURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, transistors formed in a circuit region and a seal ring region may need different transistor architectures. Multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs) in circuit regions. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. As a comparison, FinFETS or MBC transistors formed in a seal ring region are generally not for functional purpose. Structural strength instead of transistor performance, such as avoiding transistor active region collapse, becomes the key concern. Therefore, while existing seal ring structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
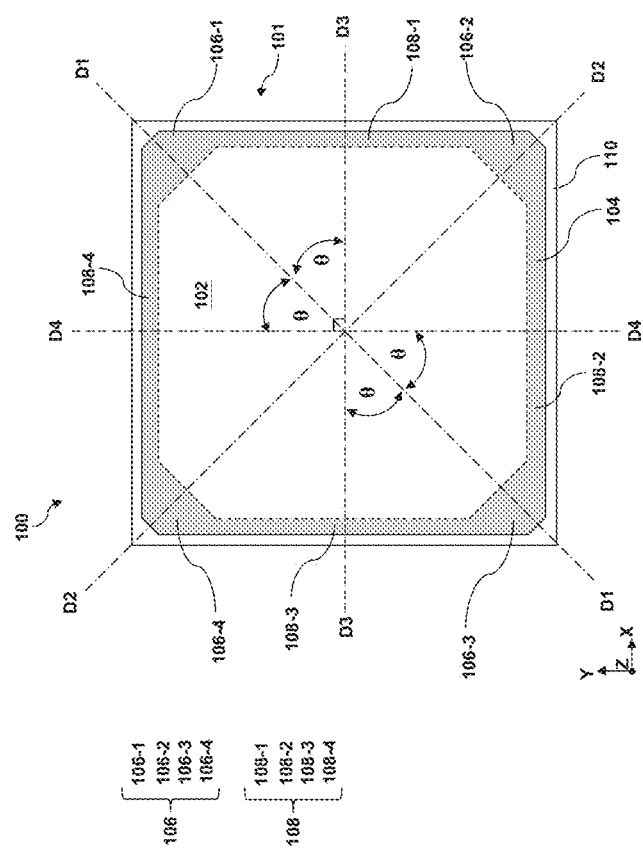
FIG. 1 illustrates a top view of an integrated circuit (IC) chip, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuit region in an IC die from moisture degradation, ionic contamination, and dicing processes, a seal ring region is formed surrounding the circuit region. Because of the provision of seal ring structures—metal layer interconnects formed on transistors thereunder as walls—the circuit regions on the inner side of the seal ring region are protected from the influence of external environments, which may cause cracking in the semiconductor chips, thus it is possible to ensure stability of properties of the semiconductor device over a long period of time. In some embodiments, seal ring structures in the seal ring region is formed simultaneously with fabrication of the many layers that comprise the transistors and interconnects in the circuit region, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL. However, since the transistors and interconnects in the seal ring region usually do not provide circuit functions, one of the key design considerations is not circuit performance, but structural strength (or mechanical strength).

For example, when the wafers are sawed, high mechanical stresses may be applied to, and may damage, the seal ring structures. To increase the mechanical strength in the seal ring regions, corner stress release (CSR) structures as a portion of the seal ring structures may be formed at the corners of an IC die. The CSR structures are additional transistors and metal layer interconnects thereon that physically join the seal ring structures on edges of an IC die. With the formation of the CSR structures, more metal structures exist at the corner regions, which typically have greater stresses than other regions of the semiconductor chips. The stresses applied to the seal ring region may thus be spread to more metal structures, and hence the respective seal ring structures are less likely to be damaged by the stresses.

Multi-gate devices, such as FinFETs and MBC transistors, have emerged as the industry moves toward smaller device nodes. While FinFETs and MBC transistors improve gate control and short channel effects for better circuit performance in the circuit region, they have not provided better immunity from mechanical damages for seal ring structures in the seal ring region. In fact, due to their delicate dimensions and structures, they may be more prone to damages without a sophisticated design. As an example, sacrificial gate removal in a replacement gate process during MBC transistor formation may cause over etch of active regions in the CSR structures, and sacrificial layer removal thereafter may cause active region collapse. Therefore, simply migrating transistor architectures from a circuit region to a seal ring region may not cause the seal ring structures to function at their best.

The present disclosure provides embodiments of an IC die that includes seal ring structures. According to embodiments of the present disclosure, the IC die includes a circuit region and a seal ring region surrounding the circuit region. The seal ring region includes edge areas and corner areas. Edge areas are along the edges of the IC die. Corner areas are disposed at corners of the IC die. The seal ring region includes some active regions being continuous surrounding the IC die and other active regions being discontinued segments staying within the corner areas. The active region includes a channel region and source/drain regions sandwiching the channel region. Gate structures are disposed over the active region. In a top view of the IC die, the gate structures are within opposing edges of the active region. In other words, in a top view of the IC die, the perimeter (or contour) of the gate structure is within the perimeter (or contour) of the active region. Such a configuration is different from other gate structures that intersect respective active regions in the circuit region. As will be explained in further details below, this configuration ensures sacrificial layers (e.g., SiGe layers) in the active region stay under protection of a fin top layer (e.g., a Si layer) and preserves the integrity of the fin structure during a replacement gate process. Also, in the corner areas, the active region tilts an angel (e.g., 45°, 135°, 225°, or 315°) in order to connect with other portions of the active region in the edge areas. Yet, the gate structures are not titled by the same angle in the corner areas, resulting in the lengthwise direction of the gate structure is titled (but not perpendicular) with respect to the lengthwise direction of the active region. Such a configuration is different from other gate structures that intersect respective active regions in the circuit region. As will be explained in further details below, this configuration protects fin top surface from being over etched during a replacement gate process.

Reference is first made to FIG. 1, which is a top view of an integrated circuit (IC) chip (or IC die) 100. The IC chip 100 may be rectangular in shape when viewed along the Z direction. In some instances as shown in FIG. 1, the IC chip 100 is square in shape in the top view. The IC chip 100 includes a circuit region (or device region) 102 and a seal ring region 104 continuously surrounding the circuit region 102. The IC chip 100 further includes a scribe line region 110 continuously surrounding the seal ring region 104. The scribe line region 110 separate (or define) adjacent dies. The scribe line region 110 is diced therethrough in a singulation process to provide individual dies, which may then be packaged as individual IC chips. The seal ring region 104 is for forming seal ring structures thereon. The seal ring structures surrounding the circuit region 102 protect the functional circuits in the circuit region 102 from moisture degradation, ionic contamination, and damage during dicing and packaging processes.

The seal ring region 104 includes four edge areas 108 adjacent four edges of the IC chip 100. Functional circuit structures including active semiconductor devices and interconnects are generally confined in the circuit region 102. Perimeter of the circuit region 102 may be diagonally removed (e.g., at 45°) from proximity to sharp corners in order to remove functional circuit structures from the highest-stress regions of the IC chip 100 near the corners. As shown in FIG. 1, the circuit region 102 has an octagon shape. Accordingly, the seal ring region 104 also includes four corner areas 106 disposed between respective neighboring edge areas 108. The corner areas 106 are also referred to as corner stress release (CSR) areas. In some instances as shown in FIG. 1, the corner areas 106 includes a first corner area 106-1, a second corner area 106-2, a third corner area 106-3, and a fourth corner area 106-4. The edge areas 108 includes a first edge area 108-1, a second edge area 108-2, a third edge area 108-3, and a fourth edge area 108-4. The first corner area 106-1 connects the first edge area 108-1 and the fourth edge area 108-4. The second corner area 106-2 connects the first edge area 108-1 and the second edge area 108-2. The third corner area 106-3 connects the second edge area 108-2 and the third edge area 108-3. The fourth corner area 106-4 connects the third edge area 108-3 and the fourth edge area 108-4. For ease of reference, the first corner area 106-1, the second corner area 106-2, the third corner area 106-3, and the fourth corner area 106-4 may be collectively or respectively referred to as corner areas 106 or a corner area 106 as the context requires. Similarly, the first edge area 108-1, the second edge area 108-2, the third edge area 108-3, and the fourth edge area 108-4 may be collectively or respectively referred to as edge areas 108 or an edge area 108 as the context requires. In these embodiments, each of the corner areas 106 resembles a substantially right triangular area having perpendicular edges with the right-angle vertex clipped off.

In the embodiments represented in FIG. 1, the IC chip 100 includes a first diagonal line D1, a second diagonal line D2, a horizontal line D3, and a vertical line D4. The first diagonal line D1 extends from the first corner area 106-1, through the circuit region 102, to the third corner area 106-3. The horizontal line D3 is along the X direction. The first diagonal line D1 and the horizontal line D3 form an angle θ. The vertical line D4 is along the Y direction. The first diagonal line D1 and the vertical line D4 also form the angle θ. The second diagonal line D2 extends from the second corner area 106-2, through the circuit region 102, to the fourth corner area 106-4. The second diagonal line D2 and the horizontal line D3 form the angle θ. The second diagonal line D2 and the vertical line D4 also form the angle θ. The angle θ is 45 degrees (45°). In the depicted embodiments, the first diagonal line D1 and the second diagonal line D2 are perpendicular to one another.

The IC chip 100 may be fabricated on a substrate 101. In some embodiments, the substrate 101 may be a bulk silicon (Si) substrate. Alternatively, substrate 101 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 101 includes one or more group III-V materials, one or more group II-VI materials, or combinations thereof. In still some instances, the substrate 101 is a semiconductor-on-insulator substrate, such as a silicon-on-insulator (SOI) substrate, a silicon germanium-on-insulator (SGOI) substrate, or a germanium-on-insulator (GeOI) substrate. In still some instances, the substrate 101 may be diamond substrate or a sapphire substrate.

Figure 2:
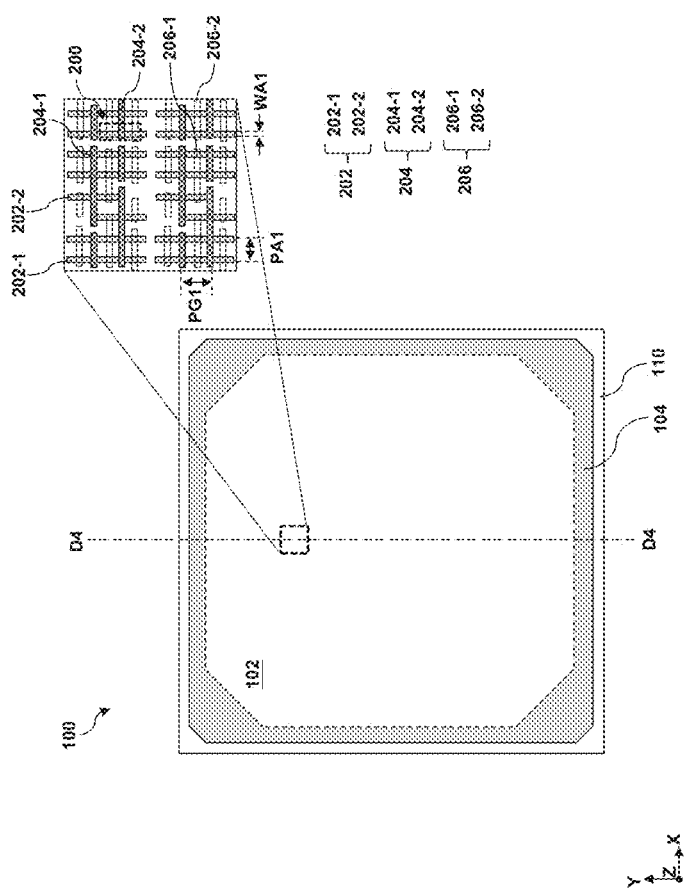
FIG. 2 illustrates an enlarged fragmentary top view of a device region of the IC chip in FIG. 1, according to one or more aspects of the present disclosure.

FIG. 2 includes an enlarged fragmentary top view of the circuit region 102. The circuit region 102 may include logic devices, memory devices, and input/output (I/O) devices. The logic devices may include, for example, inverters, AND gates, OR gates, NAND gates, NOR gates, XNOR gates, XOR gates, and NOT gates. The memory devices may include static random access memory (SRAM) devices. In some embodiments represented in FIG. 2, the circuit region 102 includes segmented active regions 202 extending along the Y direction, segmented gate structures 204 extending along the X direction, and segmented source/drain contacts 206 extending along the X direction. The segmented active regions 202, the segmented gate structures 204, and the segmented source/drain contacts 206 are segmented such that the circuit region 102 performs the functions it intends to. If the segmented active regions 202, the segmented gate structures 204, and the segmented source/drain contacts 206 are not segmented as representatively shown in FIG. 2 and are allowed to extend continuously throughout the X direction and Y direction, the circuit region 102 would not be able to perform its intended function. For example, when the segmented gate structures 204 are not segmented, they will control all transistors disposed along the X direction. For another example when the segmented source/drain contacts 206 are not segmented, they will connect all source/drain features disposed along the X direction in parallel. Put differently, the segmented active regions 202 do not extend continuously across the circuit region 102 along the Y direction; the segmented gate structures 204 do not extend continuously across the circuit region 102 along the X direction; and the segmented source/drain contacts 206 do not extend continuously across the circuit region 102 along the X direction.

The segmented active regions 202 may have different lengths. In the depicted embodiments, the segmented active regions 202 include a first segmented active region 202-1 and a second segmented active region 202-2. The first segmented active region 202-1 has a length greater than a length of the second segmented active region 202-2. The segmented gate structures 204 include a first segmented gate structure 204-1 and a second segmented gate structure 204-2. The first segmented gate structure 204-1 has a length greater than a length of the second segmented gate structure 204-2. In FIG. 2, the first segmented gate structure 204-1 is disposed over four (4) segmented active regions 202 and the second segmented gate structure 204-2 is disposed over two (2) segmented active regions 202. The segmented source/drain contacts 206 include a first segmented source/drain contact 206-1 and a second segmented sourced/drain contact 206-2. The first segmented source/drain contact 206-1 has a length greater than a length of the second segmented source/drain contact 206-2. In FIG. 2, the first segmented source/drain contact 206-1 connects source/drain features over three segmented active regions 202 and the second segmented source/drain contact 206-2 connects source/drain features over two segmented active regions 202.

The segmented active regions 202 may include silicon (Si) or a suitable semiconductor material. Along the X direction, adjacent segmented active regions 202 may sandwich a dielectric fin (or hybrid fins) therebetween. The dielectric fins (not shown) improve fin density and help confining source/drain features. Each of the segmented gate structures 204 includes a gate dielectric layer and a gate electrode layer over the gate dielectric layer. In some embodiments, while not explicitly shown in the figures, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), SrTiO$_3$ (STO), BaTiO$_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO$_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the segmented gate structures 204 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

Each of the segmented sourced/drain contacts 206 may include a barrier layer, a silicide layer, and a metal filler layer disposed over the silicide layer. The barrier layer may include titanium nitride or tantalum nitride. The silicide layer may include titanium silicide, tantalum silicide, cobalt silicide, nickel silicide, or tungsten silicide. The silicide layer interfaces the source/drain features to reduce contact resistance. The source/drain features are formed by epitaxial deposition of semiconductor materials such as silicon or silicon germanium and may be doped with an n-type dopant, such as phosphorus (P) or arsenic (As) or a p-type dopant, such as boron (B) or boron difluoride (BF$_2$). The metal fill layer may include ruthenium (Ru), copper (Cu), nickel (Ni), cobalt (Co), or tungsten (W).

Reference is still made to FIG. 2. The segmented active regions 202, although having different lengths along the Y direction, are disposed at a first active region pitch PA1 along the X direction. The segmented gate structures 204, although having different lengths along the X direction, are disposed at a first gate pitch PG1 along the Y direction. In some embodiments, the first active region pitch PA1 may be between about 25 nm and about 40 nm and the first gate pitch PG1 may be between about 30 nm and about 65 nm. Each of the segmented active regions 202 has a first active region width WA1. In some instances, the first active region width WA1 may be between about 10 nm and about 20 nm.

Figure 3:
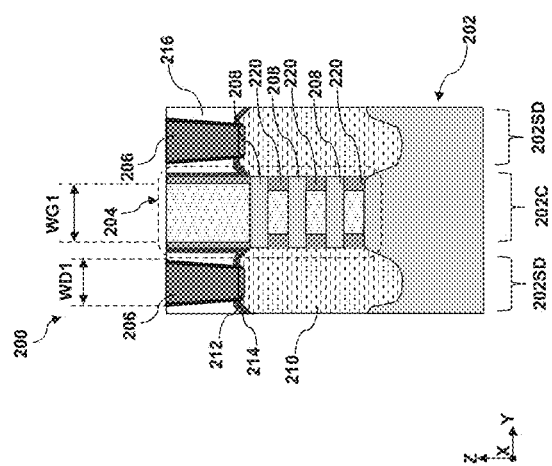
FIG. 3 illustrates a fragmentary cross-sectional view of a semiconductor device in the device region of the IC chip in FIG. 1, according to one or more aspects of the present disclosure.

Reference is now made to FIG. 3, which illustrates a fragmentary cross-sectional view along the vertical line D4 across a first semiconductor device 200 (FIG. 2) in the circuit region 102. In the depicted embodiment, the first semiconductor device 200 is an MBC transistor. Each of the segmented active regions 202 includes a channel region 202C disposed between two source/drain regions 202SD. In the channel region 202C, the segmented active region 202 includes a vertical stack of channel members 208 that extend along the Y direction. The channel members 208 extend between two source/drain features 210, each of which is disposed over a source/drain region 202SD. It is noted that three (3) layers of the channel members 208 are illustrated, which is for illustrative purposes only and not intended to be limiting beyond what is specifically recited in the claims. It can be appreciated that any number of channel members 208 can be formed. In some embodiments, the number of channel members 208 is between 2 and 10. As described above, the source/drain features 210 may include silicon (Si) doped with an n-type dopant or silicon germanium (SiGe) doped with a p-type dopant. The channel members 208 may be referred to as nanostructures due to their nano-scale dimensions. In some instances, the channel members 208 may be referred to as nanosheets when their width is greater than their thickness. In some other instances, the channel members 208 may be referred to as nanowires when their width is substantially similar to their thickness. A segmented gate structure 204 is disposed over the channel region 202C to wrap around each of the channel members 208. The segmented gate structure 204 may be formed by a replacement gate process. That is, a sacrificial gate structure, such as a polysilicon gate structure, may be formed over the respective segmented active region 202 as a placeholder for a to-be-formed metal gate structure. The sacrificial gate structure may include a sacrificial interfacial layer and a sacrificial gate electrode layer. The sacrificial interfacial layer may include a dielectric material such as silicon oxide layer or silicon oxynitride, and may be formed by chemical oxidation, thermal oxidation, atomic layer deposition (ALD), chemical vapor deposition (CVD), and/or other suitable methods. The sacrificial gate electrode may include poly-crystalline silicon (poly-Si) and may be formed by suitable deposition processes such as low-pressure chemical vapor deposition (LPCVD) and plasma-enhanced CVD (PECVD). The various layers of the sacrificial gate structure may be formed by photolithography and etching processes. Subsequently, the sacrificial gate structures are replaced by metal gate structures in a replacement gate process. The replacement gate process may include removing the sacrificial gate structures to form gate trenches, releasing channel members 208 in the gate trenches by removing sacrificial layers (e.g., SiGe layers) that interleave with the channel members 208, and forming metal gate structures wrapping around each of the channel members 208. The gate structures are be patterned into segments in a gate-cut process. As shown in FIG. 3, the segmented gate structure 204 is spaced apart from the source/drain features 210 by inner spacer features 220. The channel members 208 over the channel region 202C are vertically separated from one another by the inner spacer features 220. The inner spacer features 220 may include silicon nitride, silicon oxynitride, silicon carbonitride, or silicon oxycarbonitride.

A contact etch stop layer (CESL) 214 is disposed over the source/drain features 210 and an interlayer dielectric (ILD) layer 216 over the CESL 214. A source/drain contact 206 extends through the CESL 214 and the ILD layer 216 to come in contact with the source/drain feature 210. In some examples, the CESL 214 includes silicon nitride, silicon oxynitride, and/or other materials known in the art. The ILD layer 216 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contacts 206 extend through the ILD layer 216 and the CESL 214 to electrically couple to the source/drain features 210 by way of the silicide layer 212. As shown in FIG. 3, the segmented source/drain contact 206 has a first contact width WD1 along the Y direction and the segmented gate structure 204 has a first gate width WG1 along the Y direction. In some instances, the first contact width WD1 is between about 15 nm and about 25 nm and the first gate width WG1 is between about 20 nm and about 30 nm.

Figure 4:
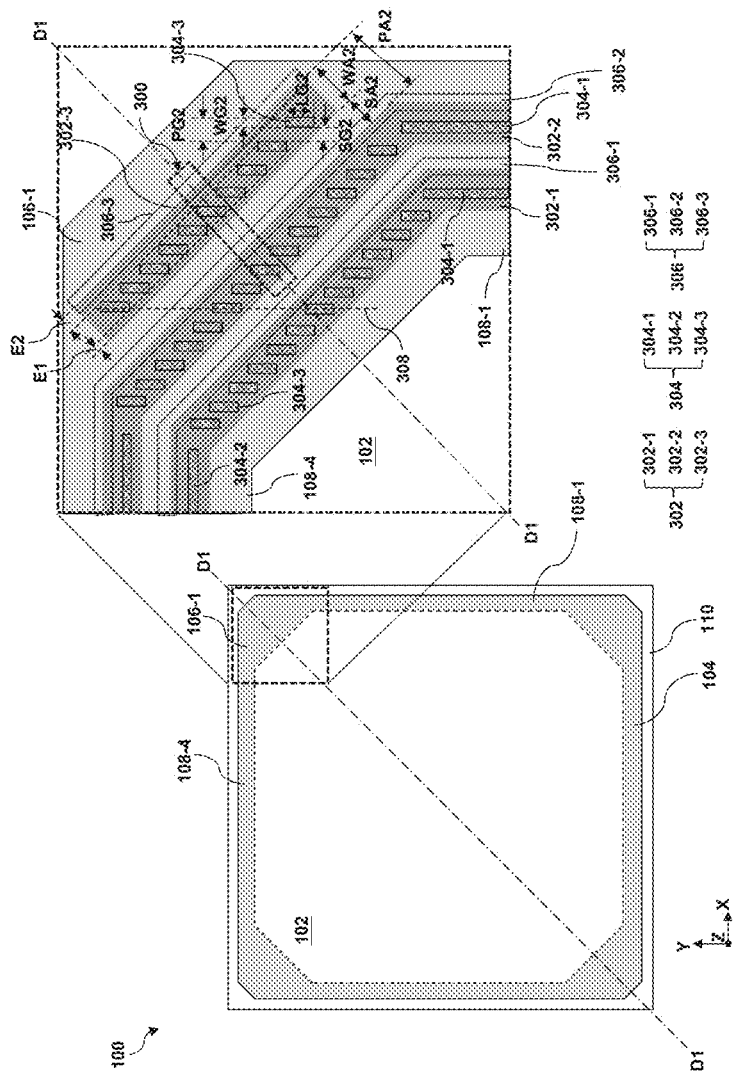
FIGS. 4, 6, 8, 9, and 10 illustrate enlarged fragmentary top views of a corner area of a seal ring region of the IC chip in FIG. 1, according to one or more aspects of the present disclosure.

Reference is then made to FIG. 4, which includes an enlarged fragmentary top view of a corner area 106. For illustration purposes, the first corner area 106-1 (and adjacent portions from edge areas 108-1 and 108-4) is shown in FIG. 4 but similar descriptions apply to the other three corner areas 106-2, 106-3, and 106-4. In the embodiments represented in FIG. 4, semiconductor structures, including active regions 302, gate structures 304, source/drain contacts 306, serve as seal ring structures. That is, the semiconductor structures in the corner areas 106 do not provide transistor functions. There are multiple active regions 302 extending perpendicular to the first diagonal line D1 in the corner area 106. Some inner active regions 302 are concentric rings extending continuously around the circuit region 102. Some outer active regions 302 are segmented active regions that are confined within the corner area 106. In the depicted embodiment, three active regions 302 are shown, which includes two continuous active regions 302-1 and 302-2 forming concentric rings and one segmented active region 302-3 filling space in the corner. This is for illustrative purposes only and not intended to be limiting beyond what is specifically recited in the claims. It can be appreciated that any number of continuous active regions and any number of segmented active regions can be formed in the corner area 106. For ease of reference, the active regions 302-1, 302-2, and 302-3 may be collectively or respectively referred to as active regions 302 or an active region 302 as the context requires.

The first active region 302-1 is a concentric ring extending continuously around the circuit region 102 and through the first corner area 106-1, the first edge area 108-1, the second corner area 106-2, the second edge area 108-2, the third corner area 106-3, the third edge area 108-3, the fourth corner area 106-4, the fourth edge area 108-4 in sequence. In the first corner area 106-1, the first active region 302-1 extends perpendicular to the first diagonal line D1; in the first edge area 108-1, the first active region 302-1 extends in the Y direction; in the second corner area 106-2, the first active region 302-1 extends perpendicular to the second diagonal line D2; in the second edge area 108-2, the first active region 302-1 extends in the X direction; in the third corner area 106-3, the first active region 302-1 extends perpendicular to the first diagonal line D1; in the third edge area 108-3, the first active region 302-1 extends in the Y direction; in the fourth corner area 106-4, the first active region 302-1 extends perpendicular to the second diagonal line D2; in the fourth edge area 108-4, the first active region 302-1 extends in the X direction. The second active region 302-2 is a concentric ring extending continuously around the circuit region 102 and through the first corner area 106-1, the first edge area 108-1, the second corner area 106-2, the second edge area 108-2, the third corner area 106-3, the third edge area 108-3, the fourth corner area 106-4, the fourth edge area 108-4 in sequence. In the first corner area 106-1, the second active region 302-2 extends perpendicular to the first diagonal line D1; in the first edge area 108-1, the second active region 302-2 extends in the Y direction; in the second corner area 106-2, the second active region 302-2 extends perpendicular to the second diagonal line D2; in the second edge area 108-2, the second active region 302-2 extends in the X direction; in the third corner area 106-3, the second active region 302-2 extends perpendicular to the first diagonal line D1; in the third edge area 108-3, the second active region 302-2 extends in the Y direction; in the fourth corner area 106-4, the second active region 302-2 extends perpendicular to the second diagonal line D2; in the fourth edge area 108-4, the second active region 302-2 extends in the X direction. The third active region 302-3 is a segmented active region confined within the corner area 106. The third active region 302-3 extends perpendicular to the first diagonal line D1. In some embodiments, there may be multiple segmented active regions 302 in the corner area 106. Closer to the right-angle vertex of the corner area 106, a segmented active region 302-3 may be shorter due to limited available space to dispose.

In some embodiments, each of the active regions 302 has a second active region width WA2. In some instances, the second active region width WA2 is larger than the first active region width WA1 in the circuit region 102. This is because the active regions 302 are not for functional circuits but foundational support for "walls" of metal layer interconnects formed thereon. A larger active region width provides better mechanical strength for the seal ring structures. For example, the second active region width WA2 may be between about 50 nm to about 300 nm. A ratio between the second active region width WA2 and the first active region width WA1 may range from about 3:1 to about 15:1. This range provides a good compromise of effective mechanical strength and acceptable seal ring dimensions, such that when the ratio is less than 3:1, the mechanical strength may be not sufficient and when the ratio is larger than 15:1, the seal ring region has to be enlarged to accommodate larger seal ring structures and become less cost effective. The active regions 302, although having different lengths, are disposed with a second active region spacing SA2 between adjacent active regions 302 (that is, at a second active region pitch PA2 that is the sum of WA2 and SA2) along the first diagonal line D1. In some embodiments, a ratio between the second active region width WA2 and the second active region spacing SA2 may range from about 0.5 to about 1.5. Along the first diagonal line D1, adjacent active regions 302 may sandwich a dielectric fin (or hybrid fins) therebetween. The dielectric fins (such as dielectric fins 324 in FIG. 5) improve fin density and help confining source/drain features.

Reference is still made to FIG. 4. Segmented gate structures 304 are disposed on the active regions 302. Different from the segmented gate structures 204 in the circuit region 102, which intersect respective active regions 302, the segmented gate structures 304 in the seal ring region 104 are confined within respective active regions 302 in a top view. That is, in the depicted embodiment, no portions of the segmented gate structures 304 overlap on edges of the active regions 302. In other words, in a top view, a perimeter (or contour) of a segmented gate structure 304 is within a perimeter (or contour) of a respective active region 302 that the segmented gate structure 304 is disposed thereon. In the depicted embodiments, a segmented gate structure 304-1 extending along the Y direction is disposed on the portion of the first active region 302-1 in the first edge area 108-1; a segmented gate structure 304-2 extending along the X direction is disposed on the portion of the first active region 302-1 in the fourth edge area 108-4; and multiple segmented gate structures 304-3 extending along the Y direction are disposed on the portion of the first active region 302-1 in the corner area 106-1. Similarly, a segmented gate structure 304-1 extending along the Y direction is disposed on the portion of the second active region 302-2 in the first edge area 108-1; a segmented gate structure 304-2 extending along the X direction is disposed on the portion of the second active region 302-2 in the fourth edge area 108-4; and multiple segmented gate structures 304-3 extending along the Y direction are disposed on the portion of the second active region 302-2 in the corner area 106-1. Regarding the third active region 302-3, there are multiple segmented gate structures 304-3 extending along the Y direction are disposed thereon. The segmented gate structures 304-1, 304-2, and 304-3 may be collectively or respectively referred to as segmented gate structures 304 or a segmented gate structure 304 as the context requires.

Each of the segmented gate structures 304 includes a gate dielectric layer and a gate electrode layer over the gate dielectric layer. In some embodiments, while not explicitly shown in the figures, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the segmented gate structures 304 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process.

In some embodiments, each of the segmented gate structures 304 in the corner area 106 has a second gate width WG2 and a second gate length LG2. In some instances, the second gate width WG2 is substantially similar to the first gate width WG1. In some instances, the second gate width WG2 is larger than the first gate width WG1, such as a ratio between the second gate width WG2 and the first gate width WG1 ranging from about 1:1 to about 3:1. If the second gate width WG2 is smaller than the first gate width WG1, it increases undesired particles during the dicing process in some instances. If the ratio is larger than 3:1, it impacts active regions below and contact layer above and decreases device uniformity in some instances. A ratio between the second gate length LG2 and the second gate width WG2 may range from about 5:1 to about 20:1. The segmented gate structures 304 are disposed at a second gate spacing SG2 between adjacent segmented gate structures 304 (that is, at a second gate pitch PG2 that is the sum of WG2 and SG2) along the X direction. In some embodiments, a ratio between the second gate width WG2 and the second gate spacing SG2 may range from about 0.1:1 to about 2:1. In some embodiments, the second gate width WG2 ranges from about 18 nm to about 25 nm. In some embodiments, the second gate length LG2 ranges from about 180 nm to about 250 nm.

The segmented gate structures 304 may be formed by a replacement gate process and a gate cut process. In an exemplary embodiment, a sacrificial gate structure, such as a polysilicon gate, may be first formed over the active regions 302 as a placeholder for segmented metal gate structures. The sacrificial gate structure may intersect each of the active regions 302. A gate cut process patterns the sacrificial gate structure into segments with each segment within the perimeter of a respective active region. Therefore, after the replacement gate process, each segmented metal gate structure is on an extension line of its counterpart disposed on an adjacent active region, such as represented by the dashed line 308 in FIG. 4. The replacement gate process first removes the segmented sacrificial gate structures in forming gate trenches that expose top surfaces of the active regions 302, and subsequently deposits metal gate layers in the gate trenches in forming the segmented gate structures 304.

Instead of aligning segmented gate structures 304 in a direction perpendicular to the first diagonal line D1 such that the segmented gate structures 304 in different areas of the seal ring region 104 can be connected as a continuous concentric ring, the gate structures 304 in the corner area 106 are segmented and extending lengthwise along the Y direction (thereby forming a tilted angle (e.g., an acute angle of 45 degrees) with the lengthwise direction of the active region 302), and further confined within the perimeters of the active regions 302. This brings benefits of at least two folds. The first fold is that keeping the gate lengthwise direction along the Y direction, therefore forming an angle θ (as in FIG. 1) with respective to lengthwise direction of the active region 302, would expose (1, 1, 1) crystalline plane of the active regions 302 in gate trenches during the replacement gate process. As a comparison, if the gate structures 304 remain continuous as a concentric ring and extends lengthwise along the lengthwise direction of the active regions 302 in the corner area 106, it would be (1, 0, 0) crystalline plane of the active regions 302 that is exposed in the gate trenches. The (1, 0, 0) crystalline plane generally suffers much higher etch rate (e.g., 10 times) than the (1, 1, 1) crystalline plane, which may cause over etch during the gate trench formation and thus reduce mechanical strength of the active regions 302. The second fold is that keeping the perimeters of the segmented gate structures 304 inside the perimeters of the active regions 302 allows top surfaces of the active regions 302 function as an etch stop layer to protect other layers under the topmost layer in fins of the active regions 302 during the replacement gate process. For MBC transistors manufacturing flow, the replacement gate process includes a channel member release process, which removes sacrificial layers (e.g., SiGe layers) that interleave with the channel layers (e.g., Si layers). Yet since in the seal ring region 104 the seal ring structures are not for forming functional circuits but still receive the same processes as the functional circuit structures in the circuit region 102, the sacrificial layers are better not to be removed but remain in the fins of the active regions 302 to avoid forming suspended channel members in the seal ring structures, which may cause foundation collapse. On the other hand, by having the perimeters of the segmented gate structures 304 inside the perimeters of the active regions 302, gate trenches would not expose sidewalls of the sacrificial layers but merely the top surfaces of the active regions 302. Consequently, the sacrificial layers (e.g., SiGe layers) remain intact under the topmost layer (e.g., a Si layer) in the fins of the active regions 302.

Reference is still made to FIG. 4. In the depicted embodiment, the segmented gate structures 304 are not disposed in the middle between two opposing edges of a respective active region 302, but offset towards one edge. A smaller distance from an edge of the active region 302 to a closest vertex of a segmented gate structure 304 is denoted as first distance E1. A larger distance from the other edge of the active region 302 to a closest vertex of a segmented gate structure 304 is denoted as second distance E2. Unlike in the circuit region 102 where the distances E1 and E2 equal, E1 and E2 in the seal ring region 104 are not equal. This is for sparing larger landing area for forming a source/drain contact 306 (represented by boxes of dash lines in FIG. 4) on one side of an active region 302. Since the seal ring structures are not for functional circuits, there is no need to form a pair of source/drain contacts 306 on both sides of an active region 302. The design considerations of seal ring structures are focusing on mechanical strengths of a "wall" of metal layers of interconnects that is built on the source/drain contacts 306. A single but wider source/drain contact 306 on one side of the active region 302 provides stronger foundational support. A ratio between the second distance E2 and the first distance E1 may range from about 1:1 to about 8:1 in the seal ring region 104. If the ratio is smaller than 1:1, the source/drain contact 306 may not have sufficient landing area for providing desired mechanical strength. If the ratio is larger than 8:1, the segmented gate structures 304 may be too close to edges of the active regions and overlaying inaccuracy may bring up risks of exposing sidewalls of sacrificial layers in the gate trenches during the replacement gate process.

In the depicted embodiment, the first source/drain contact 306-1 overlaps an outer edge (distal from the circuit region 102) of the first active region 302-1. The first source/drain contact 306-1 is a concentric ring extending continuously around the circuit region 102 and through the first corner area 106-1, the first edge area 108-1, the second corner area 106-2, the second edge area 108-2, the third corner area 106-3, the third edge area 108-3, the fourth corner area 106-4, the fourth edge area 108-4 in sequence. In each of the edge and corner areas, the first source/drain contact 306-1 extends lengthwise along the lengthwise direction of the first active region 302-1. Similarly, the second source/drain contact 306-2 overlaps an outer edge of the second active region 302-1. The second source/drain contact 306-2 is a concentric ring extending continuously around the circuit region 102 and through the first corner area 106-1, the first edge area 108-1, the second corner area 106-2, the second edge area 108-2, the third corner area 106-3, the third edge area 108-3, the fourth corner area 106-4, the fourth edge area 108-4 in sequence. In each of the edge and corner areas, the second source/drain contact 306-2 extends lengthwise along the lengthwise direction of the second active region 302-2. Regarding the third source/drain contact 306-3, it overlaps with an outer edge of the third active region 302-3 and is confined within the corner area 106.

Figure 5:
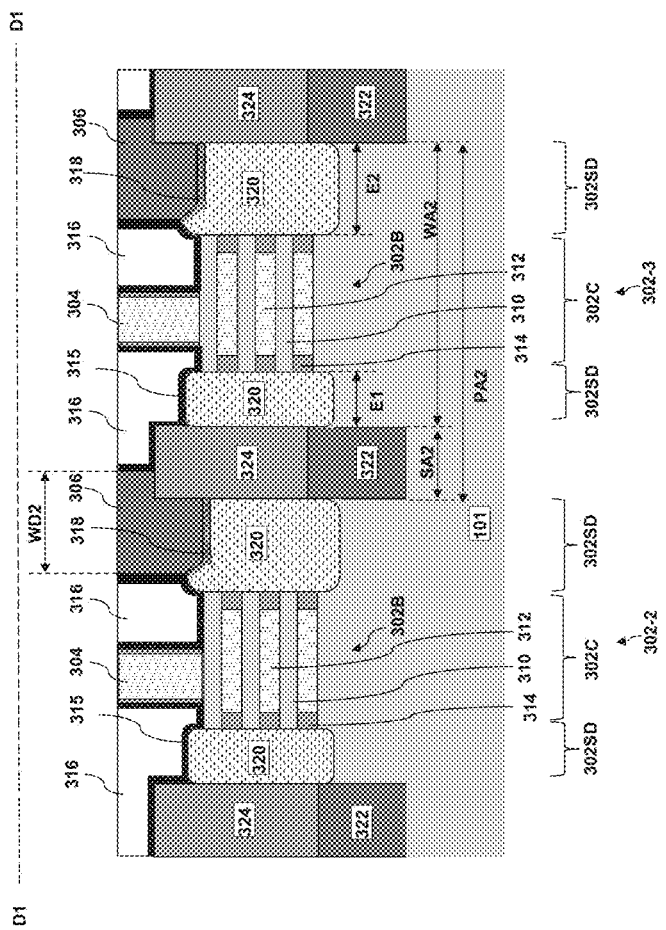
FIGS. 5 and 7 illustrate fragmentary cross-sectional views of a semiconductor device in a corner area of a seal ring region of the IC chip in FIG. 1, according to one or more aspects of the present disclosure.

Reference is now made to FIG. 5, which illustrates a fragmentary cross-sectional view along the first diagonal line D1 across a region 300 (FIG. 4) that includes portions of the second active region 302-2 and the third active region 302-3. Each of the active regions 302 includes a base portion 302B protruding from the substrate 101 and a channel region 302C disposed between two source/drain regions 302SD and above the base portion 302B. The base portion 302B is surrounded by isolation feature 322. The isolation feature 322 may be referred to as a shallow trench isolation (STI) feature 322. In some embodiments, the dielectric material of the isolation feature 322 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In the depicted embodiment, dielectric fins 324 are deposited between adjacent active regions 302 and on the isolation feature 322 to confine source/drain features 320. The dielectric fins 324 may include multiple dielectric layers, such as a low-k dielectric material layer and a high-k dielectric material layer formed thereon, and are also referred to as hybrid dielectric fins or hybrid fins.

The channel region 302C includes an epitaxial stack of alternating semiconductor layers 310 and 312. Particularly, the epitaxial stack includes epitaxial layers 310 of a first composition interposed by epitaxial layers 312 of a second composition. The first and second compositions are different. In the depicted embodiment, the epitaxial layers 310 are Si and the epitaxial layers 312 are SiGe. However, other embodiments are possible including those that provide for a first composition and a different second composition. For example, in some embodiments, either of the epitaxial layers 310, 312 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 310 and 312 are substantially dopant-free (i.e., having an extrinsic dopant concentration from about 0 cm$^{-3}$ to about 1×10$^{17}$ cm$^{-3}$), where for example, no intentional doping is performed during the epitaxial growth process. By way of example, epitaxial growth of the epitaxial layers 310, 312 of the first composition or the second composition may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 310 include the same material as the substrate 101. The substrate 202 is a crystalline substrate and the epitaxial layers 310, 312 are crystalline semiconductor layers.

In some embodiments, the epitaxial layers 310 in the seal ring region 104 and the channel members 208 in the circuit region 102 are formed from the same semiconductor layers and later patterned into fins in different active regions. Accordingly, the epitaxial layers 310 and the channel members 208 may have the same composition and thickness. In some instances, each epitaxial layer 310 has a thickness ranging from about 6 nanometers (nm) to about 12 nm. The epitaxial layers 310 may be substantially uniform in thickness. In some embodiments, each epitaxial layer 312 has a thickness ranging from about 3 nm to about 6 nm. In some embodiments, the epitaxial layers 312 are substantially uniform in thickness. In the circuit region 102, sacrificial layers interleaved with the channel members 208 are eventually removed from gate trenches in the replacement gate process, such that the channel members 208 are wrapped around by the segmented gate structure 204. As a comparison, in the seal ring region 104, the epitaxial layers 312 remain in the active regions 302 due to the smaller segmented gate structures 304 that would not expose the epitaxial layers 312 in gate trenches. Since the counterparts of the epitaxial layers 312 in the circuit regions 102 are removed, the epitaxial layers 312 may also be referred to as sacrificial layers, and epitaxial layers 310 may also be referred to as channel layers. It is noted that three (3) layers of the epitaxial layers 310 and three (3) layers of the epitaxial layers 312 are alternately arranged as illustrated in FIG. 5, which is for illustrative purposes only and not intended to be limiting beyond what is specifically recited in the claims. It can be appreciated that any number of epitaxial layers can be formed in the stack. In some embodiments, the number of either epitaxial layers 310 or epitaxial layers 312 is between 2 and 10.

The epitaxial layers 310 and 312 extend between two source/drain features 320, each of which is disposed over a source/drain region 302SD. The source/drain features 310 may include silicon (Si) doped with an n-type dopant or silicon germanium (SiGe) doped with a p-type dopant. Segmented gate structures 304 are disposed on the topmost epitaxial layer 310. Different from the segmented gate structures 204 in the circuit region 102, the segmented gate structures 304 do not wrap around the epitaxial layers 310. As shown in FIG. 5, the segmented gate structure 304 is not disposed in the middle of the respective active region 302, but closer to one edge of the active region 302, leaving larger space on the other edge in forming a relatively larger source/drain feature 320. In the depicted embodiment, the source/drain feature 320 that is closer to the segmented gate structure 304 has a smaller width (≈E1) along the first diagonal line D1, and the other source/drain feature 320 that is distant to the segmented gate structure 304 has a larger width (≈E2) along the first diagonal line D1. The wider source/drain feature 320 also has larger volume and may be also deeper in the Z direction. The inner spacer features 314 interpose the epitaxial layers 312 and the source/drain feature 320. The inner spacer features 314 may include silicon nitride, silicon oxynitride, silicon carbonitride, or silicon oxycarbonitride. The segmented gate structures 304 are disposed on the top surface of the stack of alternating first semiconductor layers 310 and second semiconductor layers 312. In a top view, a perimeter of a segmented gate structure 304 is further within a perimeter (defined by sidewalls of the source/drain features 320) of the stack on which the segmented gate structure 304 is disposed.

A contact etch stop layer (CESL) 315 is disposed over the source/drain features 320 and an interlayer dielectric (ILD) layer 316 over the CESL 315. A source/drain contact 306 extends through the CESL 315 and the ILD layer 316 to come in contact with the wider source/drain feature 320. In some examples, the CESL 315 includes silicon nitride, silicon oxynitride, and/or other materials known in the art. The ILD layer 316 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The source/drain contacts 306 extend through the ILD layer 316 and the CESL 315 to electrically couple to the wider source/drain features 320 by way of the silicide layer 318. As shown in FIG. 5, the source/drain contact 306 has a second contact width WD2 along the first diagonal line D1. In some instances, the second contact width WD2 is between about 75 nm and about 250 nm. The second contact width WD2 is larger than the first contact width WD1 in the circuit region 102. A ratio between the second contact width WD2 and the first contact width WD1 may range from about 5:1 to about 15:1. In the depicted embodiment, the source/drain contact 306 partially covers a top surface of the dielectric fin 324.

Figure 6:
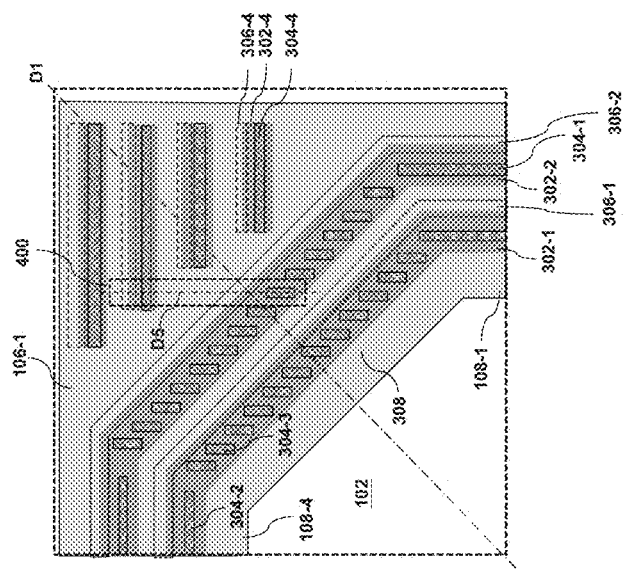
Figure 8:
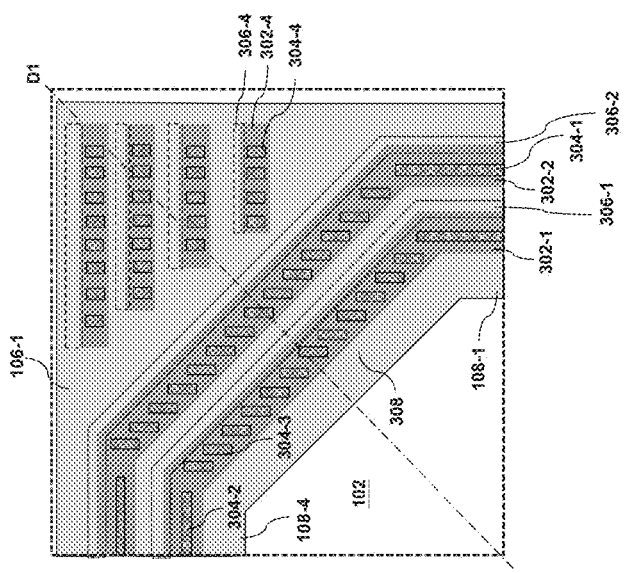
Figure 9:
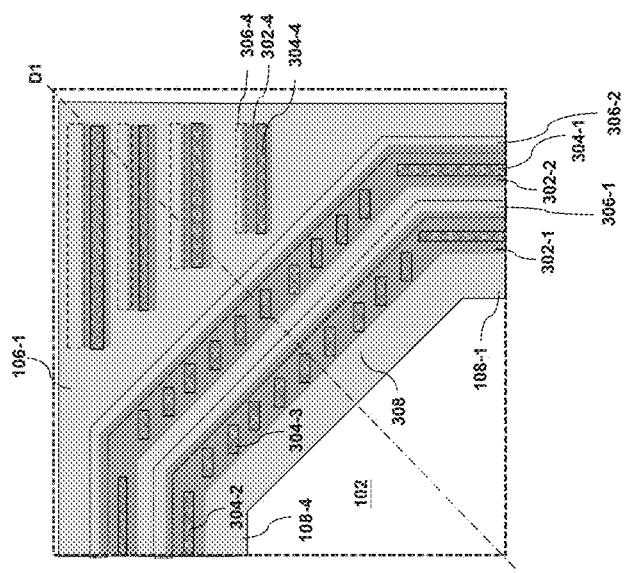
Figure 10:
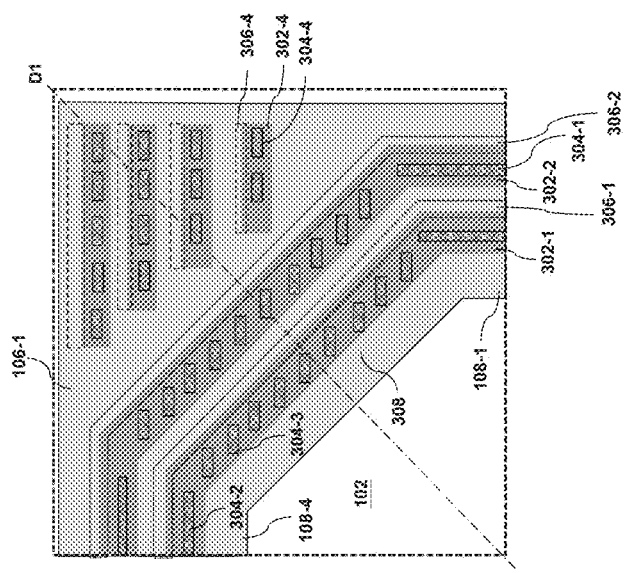

FIG. 6 illustrates another embodiment of the fragmentary top view of a corner area 106. Many aspects of the embodiment in FIG. 6 are the same as or similar to those depicted in FIG. 4. Reference numerals are repeated for ease of understanding. One difference is that the embodiment as depicted FIG. 6 has multiple straight segmented active regions 302-4 disposed between the active regions 302-1, 202-2 and edges of the IC die. The active regions 302-4 may extend horizontally as in the illustrated embodiment or extend vertically. The gate structures 304-4 are disposed on the active regions 302-4 extending in the same lengthwise directions. The position of the gate structures 304-4 are offset from a center of the active regions 302-4. Source/drain contacts 306-4 are disposed on one edge of the active regions 302-4. Depending on the orientation of segmented gate structures, various other embodiments are possible, as shown in FIGS. 8-10. In FIG. 8, the gate structures 304-4 on the active regions 302-4 are also segmented and oriented in the same direction as the gate structures 304-3 in the active regions 302-1 and 302-2. In FIG. 9, the segmented gate structures 304-3 are in oriented in the same direction as the gate structures 304-4. In FIG. 10, the gate structures 304-3 and 304-4 are both segmented and oriented horizontally.

Figure 7:
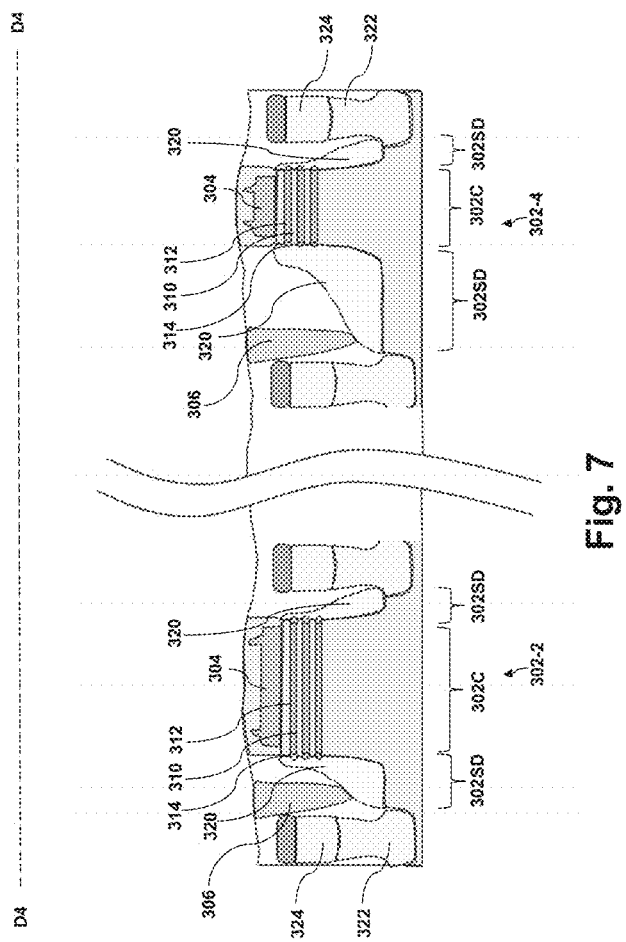

FIG. 7 illustrates a fragmentary cross-sectional view along a vertical line D5 across a region 400 (FIG. 6) that includes portions of the active region 302-2 and the active region 302-4. The fragmentary cross-sectional view depicted in FIG. 7 more closely resembles the actual shape of the devices described herein. Many aspects of the embodiment in FIG. 7 are the same as or similar to those depicted in FIG. 5. Reference numerals are repeated for ease of understanding and details of these elements are not necessarily repeated again below.

Figure 11:
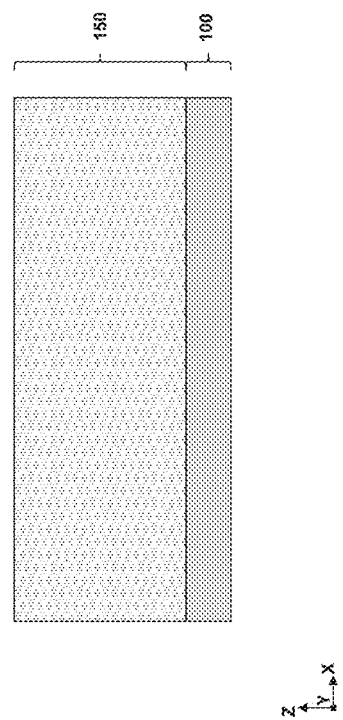
FIG. 11 illustrates a cross-sectional view of an interconnect structure disposed on the IC chip in FIG. 1, according to one or more aspects of the present disclosure.

FIG. 11 illustrates a cross-sectional view of an interconnect structure 150 disposed on the IC chip 100 in FIG. 1. The interconnect structure 150 may include more than 9 metal line layers, such as between 10 metal layers and 14 metal layers. Each of the metal layers includes conductive lines embedded in an intermetal dielectric (IMD) layer. The interconnect structures 150 also includes contact vias to vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include copper (Cu), titanium nitride (TiN), tungsten (W), or ruthenium (Ru). In the present disclosure, metal layer interconnects of the interconnect structure 150 in the seal ring region are able to land on relatively larger source/drain contacts that are well supported by active regions thereunder with less concern of active region over etch or collapse due to the replacement gate process in the manufacturing of the IC chip.

In one exemplary aspect, the present disclosure is directed to an integrated circuit (IC) chip. The IC chip includes a circuit region, and a seal ring region surrounding the circuit region. The seal ring region includes a first active region extending lengthwise in a first direction, and a first gate structure disposed on the first active region, the first gate structure extending lengthwise in a second direction that is tilted from the first direction, wherein the first direction and the second direction form a tilted angle therebetween. In some embodiments, the tilted angle formed between the first direction and the second direction is about 45 degrees. In some embodiments, the first gate structure extends lengthwise parallel to an edge of the IC chip. In some embodiments, the first active region extends lengthwise in a 45-degree angle with respect to the edge of the IC chip. In some embodiments, a perimeter of the first gate structure is within a perimeter of the first active region. In some embodiments, the first active region includes a first edge and a second edge that is opposing the first edge, and wherein the first edge is distant from the first gate structure for a first distance and the second edge is distant from the first gate structure for a second distance that is larger than the first distance. In some embodiments, a ratio between the second distance and the first distance ranges from about 1:1 to about 8:1. In some embodiments, the circuit region also includes a second active region, and a second gate structure disposed on the second active region. A ratio between a width of the first active region and a width of the second active region ranges from about 3:1 to about 15:1. In some embodiments, the second active region includes a plurality of channel members vertically stacked, each of the channel members is wrapped around by the second gate structure, and the first active region includes a stack of alternating first semiconductor layers and second semiconductor layers. In some embodiments, the first active region and the first gate structure is within a corner stress release (CSR) area of the seal ring region.

In another exemplary aspect, the present disclosure is directed to an IC chip. The IC chip includes an active region, the active region including a stack of alternating first semiconductor layers and second semiconductor layers and two source/drain features sandwiching the stack, and a gate structure disposed on a top surface of the stack, in a top view a contour of the gate structure being within a contour of the active region. In some embodiments, in the top view the contour of the gate structure is within a contour of the stack. In some embodiments, the two source/drain features have different widths. In some embodiments, the active region has two opposing edges, and the two opposing edges have different distances to the gate structure. In some embodiments, the IC chip further includes a source/drain contact disposed on a first of the two source/drain features, wherein there is no other source/drain contact disposed on a second of the two source/drain features. In some embodiments, a lengthwise direction of the active region and a lengthwise direction of the gate structure form a 45-degree angle.

In yet another exemplary aspect, the present disclosure is directed to a corner stress release (CSR) structure. The CSR structure includes a semiconductor fin of alternating first semiconductor layers and second semiconductor layers that are vertically stacked, a first epitaxial feature, a second epitaxial feature, wherein the first and second epitaxial features sandwich the semiconductor fin, a dielectric fin adjacent the second epitaxial feature, and a gate structure disposed on the semiconductor fin. The semiconductor fin extends lengthwise in a first direction, the gate structure extends lengthwise in a second direction that is different from the first direction, the first and second directions form a tilted angle. In some embodiments, the tilted angle is about 45 degrees. In some embodiments, the second epitaxial feature has a larger width than the first epitaxial feature. In some embodiments, the CSR structure further includes a contact feature landing on the second epitaxial feature, wherein the contact feature partially covers a top surface of the dielectric fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:
   a circuit region; and
   a seal ring region surrounding the circuit region, the seal ring region comprising:
   a first active region extending lengthwise in a first direction, and
   a first gate structure disposed on the first active region, the first gate structure extending lengthwise in a second direction that is tilted from the first direction, wherein the first direction and the second direction form a tilted angle therebetween, and wherein the titled angle is non-orthogonal.

2. The IC chip of claim 1, wherein the tilted angle formed between the first direction and the second direction is about 45 degrees.

3. The IC chip of claim 1, wherein the first gate structure extends lengthwise parallel to an edge of the IC chip.

4. The IC chip of claim 3, wherein the first active region extends lengthwise in a 45-degree angle with respect to the edge of the IC chip.

5. The IC chip of claim 1, wherein a perimeter of the first gate structure is within a perimeter of the first active region.

6. The IC chip of claim 1, wherein the first active region includes a first edge and a second edge that is opposing the first edge, and wherein the first edge is distant from the first gate structure for a first distance and the second edge is distant from the first gate structure for a second distance that is larger than the first distance.

7. The IC chip of claim 6, wherein a ratio between the second distance and the first distance ranges from about 1:1 to about 8:1.

8. The IC chip of claim 1, wherein the circuit region comprising:
   a second active region, and
   a second gate structure disposed on the second active region,
   wherein a ratio between a width of the first active region and a width of the second active region ranges from about 3:1 to about 15:1.

9. The IC chip of claim 8, wherein the second active region includes a plurality of channel members vertically stacked, each of the channel members is wrapped around by the second gate structure, and the first active region includes a stack of alternating first semiconductor layers and second semiconductor layers.

10. The IC chip of claim 1, wherein the first active region and the first gate structure is within a corner stress release (CSR) area of the seal ring region.

11. An integrated circuit (IC) chip, comprising:
a substrate;
an active region protruding from the substrate, wherein the active region includes a stack of alternating first semiconductor layers and second semiconductor layers and two source/drain features sandwiching the stack; and
a gate structure disposed on a top surface of the stack, wherein in a top view a contour of a top surface of an entirety of the gate structure is within a contour of a top surface of the active region.

12. The IC chip of claim 11, wherein in the top view the contour of the gate structure is within a contour of the stack.

13. The IC chip of claim 11, wherein the two source/drain features have different widths.

14. The IC chip of claim 11, wherein the active region has two opposing edges, and the two opposing edges have different distances to the gate structure.

15. The IC chip of claim 11, further comprising:
a source/drain contact disposed on a first of the two source/drain features, wherein there is no other source/drain contact disposed on a second of the two source/drain features.

16. The IC chip of claim 11, wherein a lengthwise direction of the active region and a lengthwise direction of the gate structure form a 45-degree angle.

17. A corner stress release (CSR) structure, comprising:
a semiconductor fin of alternating first semiconductor layers and second semiconductor layers that are vertically stacked;
a first epitaxial feature;
a second epitaxial feature, wherein the first and second epitaxial features sandwich the semiconductor fin;
a dielectric fin adjacent the second epitaxial feature; and
a gate structure disposed on the semiconductor fin,
wherein the semiconductor fin extends lengthwise in a first direction, the gate structure extends lengthwise in a second direction that is different from the first direction, the first and second directions form a tilted angle that is non-orthogonal.

18. The CSR structure of claim 17, wherein the tilted angle is about 45 degrees.

19. The CSR structure of claim 17, wherein the second epitaxial feature has a larger width than the first epitaxial feature.

20. The CSR structure of claim 17, further comprising:
a contact feature landing on the second epitaxial feature, wherein the contact feature partially covers a top surface of the dielectric fin.

\* \* \* \* \*